United States Patent
Mooney

(10) Patent No.: US 6,455,860 B1
(45) Date of Patent: Sep. 24, 2002

(54) RESOLUTION ENHANCEMENT DEVICE FOR AN OPTICALLY-COUPLED IMAGE SENSOR USING HIGH EXTRA-MURAL ABSORBENT FIBER

(75) Inventor: Paul E. Mooney, Pleasanton, CA (US)

(73) Assignee: Gatan, Inc., Pleasanton, CA (US)

( * ) Notice: Subject to any disclaimer, the term of this patent is extended or adjusted under 35 U.S.C. 154(b) by 173 days.

(21) Appl. No.: 09/675,787

(22) Filed: Sep. 29, 2000

Related U.S. Application Data

(60) Provisional application No. 60/156,799, filed on Sep. 30, 1999.

(51) Int. Cl.[7] ............................................. H01J 37/244
(52) U.S. Cl. ....................... 250/397; 250/306; 250/310; 250/311
(58) Field of Search ................................ 250/397, 306, 250/310, 311; 313/103 CM, 105 CM

(56) References Cited

U.S. PATENT DOCUMENTS

| | | | |
|---|---|---|---|
| 2,825,260 A | 3/1958 | O'Brien .......................... 88/1 |
| 3,703,660 A | 11/1972 | Fyler ...................... 313/92 LF |
| 4,946,238 A | 8/1990 | Sashin et al. ............ 350/96.27 |
| 4,962,306 A | * 10/1990 | Hodgson et al. ............ 250/310 |
| 5,319,731 A | 6/1994 | Eastman ...................... 385/115 |
| 5,635,720 A | 6/1997 | Mooney et al. ............. 250/397 |
| 5,754,716 A | 5/1998 | Kim et al. ..................... 385/28 |
| 5,846,638 A | 12/1998 | Meissner ..................... 428/220 |
| 5,852,622 A | 12/1998 | Meissner et al. ............. 372/39 |
| 5,990,483 A | * 11/1999 | Shariv et al. ............... 250/397 |

FOREIGN PATENT DOCUMENTS

WO   WO 97 13270   4/1997

OTHER PUBLICATIONS

Sherman et al, Performance of a Slow–Scan CCD Camera for Macromolecular Imaging in a 400 kV Electron Cryomicroscope, Verna and Mars McLean Department of Biochemistry and The W.M. Keck Center for Computational Biology, Baylor College of Medicine, Houston, Texas pp. 1–15.

Weimer, L. "Transmission electron microscopy", 1984 Springer, 1984 XP002155509 130890, p. 131, line 17, 18; figure 4.30, p. 134, col. 3–4.

\* cited by examiner

*Primary Examiner*—Bruce Anderson
*Assistant Examiner*—Nikita Wells
(74) *Attorney, Agent, or Firm*—Killworth, Gottman, Hagan & Schaeff, L.L.P.

(57) ABSTRACT

A resolution enhancement device is provided which utilizes either high extra mural absorbent optical fibers in the transfer optic, and/or which uses a transfer optic which is bonded to the scintillator without the use of any glues or adhesives. The device provides improved resolution of electron images from electron microscopes while not reducing the sensitivity of the apparatus.

19 Claims, 3 Drawing Sheets

RESOLUTION ENHANCEMENT DEVICE FOR AN OPTICALLY-COUPLED IMAGE SENSOR USING HIGH EXTRA-MURAL ABSORBENT FIBER

CROSS REFERENCE TO RELATED APPLICATIONS

This application claims the benefit of U.S. provisional application Ser. No. 60/156,799, filed Sept. 30, 1999.

BACKGROUND OF THE INVENTION

The present invention relates an apparatus for use in an electron microscope and to the detection of electron images by converting them into light images and transferring them onto an electronic light-imaging device, and more particularly to enhancing the resolution of such images while not sacrificing sensitivity.

Electron microscopes use a beam of accelerated electrons which pass through or are deflected by a sample to provide an electron image and/or diffraction pattern of the sample. To provide a record of these images and/or diffraction patterns, the electrons have been converted into light images using scintillator materials (e.g., single crystal YAG and phosphors), and the light images and/or patterns are then captured by an imaging sensor. A transfer optic, typically one or more optical lenses or a fiber optic plate, transfers the light image to the imaging sensor. While photographic film and cameras have long been used to capture such light images and/or diffraction patterns, charge-coupled devices (CCD) of the type originally developed for astronomy to read light images into a computer have found increasing use in this field. Such CCD cameras offer excellent resolution, sensitivity, linearity, up to 2,048×2,048 pixels, are reusable, and make the image available for viewing within seconds of recording.

A conductive medium is typically coated onto the entrance surface of the scintillator to prevent the buildup of electrical charges and also to prevent the entry of light from external sources. When the transfer optic is a fiber optic plate, the scintillator is typically glued onto the fiber optic plate, and the plate is then coupled with optical coupling oil or glue to the imaging sensor.

The resolution of prior art devices is limited by a number of factors including the extent to which light generated at a particular spot on the scintillator is imaged onto a single pixel at the imaging sensor. Current image coupling devices lose resolution due to leakage (scattering) of light sideways, either in the scintillator, the transfer optic, or both. Such light scattering increases background noise and creates a "haze," making it difficult to image objects generating only weak intensity light which are located near objects which generate stronger intensity light.

One solution to the problem of image resolution is suggested by Mooney et al, U.S. Pat. No. 5,635,720. There, a light absorptive layer is positioned on a scintillator to absorb reflected, scattered light from the scintillator and prevent that scattered light from reaching the imaging device. However, while improving resolution of the image, the sensitivity of the device is reduced because of the absorption of light.

Extra mural absorption materials such as glasses have been used to absorb stray light from optical fibers. However, typically, extra mural absorption glass is introduced as separate fibers into a fiber bundle (for example, every $n^{th}$ fiber is a substituted EMA fiber, where n is a number>>1). Such technique provides a statistical level of absorbed light, typically less than 10%, but does not provide the type of selective light absorption required in electron microscopy.

Accordingly, the need still exists in the art for an apparatus which will improve the ultimate resolution of image sensors used to record images from electron microscopes while not reducing the sensitivity of the apparatus.

SUMMARY OF THE INVENTION

The present invention meets that need by providing a resolution enhancement device which utilizes either high extra-mural absorbent optical fibers in the transfer optic, and/or which uses a transfer optic which is bonded to the scintillator without the use of any external glues or adhesives. The device provides improved resolution of electron images from electron microscopes while not reducing the sensitivity of the apparatus. This enable the device to be used to observe and image objects which generate only weak light intensity but which are positioned near other objects which generate stronger light intensity.

In accordance with one embodiment of the invention, an apparatus for improving the resolution of electron images is provided and includes an electron beam forming an electron image, a scintillator located in the path of the electron beam for converting the electron image into a light image, and an imaging sensor positioned to receive and record the light image. The apparatus further includes a transfer optic associated with the scintillator for transferring the optical image to the imaging sensor, the transfer optic comprising at least one optical fiber including a layer of cladding material. The at least one optical fiber is oriented lengthwise with respect to an optical axis of the apparatus, typically substantially parallel to the path of the electron beam. The at least one optical fiber includes a layer of light absorptive material on the layer of cladding material which attenuates at least a portion of off-axis light entering the transfer optic. By "off-axis" light, it is meant light which enters the transfer optic at an angle greater than the critical angle. Preferably, the transfer optic comprises multiple optical fibers packed in an array, typically a hexagonal array.

In a preferred embodiment of the invention, the imaging sensor is a charge-coupled device and the transfer optic is a fiber optic plate. The scintillator may be any scintillator material which has found use in this art including single crystal yttrium-aluminum-garnet as well as coatings of particulate phosphors. Preferably, the cladding material and the light absorptive layer have a difference in refractive indices of less than about 0.1.

A preferred environment for the present invention is in an electron microscope having a projection chamber through which an electron beam forming an electron image and/or diffraction pattern traverse. Such an apparatus includes a scintillator located in the path of the electron beam for converting the electron image into a light image, and an imaging sensor positioned to receive and record the light image. The apparatus further includes the transfer optic associated with the scintillator for transferring the optical image to the imaging sensor as described previously.

In another embodiment of the invention, an apparatus for improving the resolution of electron images is provided and includes an electron beam forming an electron image, a scintillator located in the path of the electron beam for converting the electron image into a light image, and an imaging sensor positioned to receive and record the light image. The apparatus further includes a transfer optic associated with the scintillator for transferring the optical image to the imaging sensor, with the at least one optical fiber being oriented lengthwise with respect to an optical axis of the apparatus.

In this embodiment, the transfer optic and the scintillator are bonded to one another in the absence of a bonding agent such as a glue or other adhesive. Such a glue layer increases light scattering due to refractive index mismatches at the scintillator/glue and glue/transfer optic interfaces. The present invention eliminates such a glue layer and instead directly bonds the scintillator and transfer optic to one another. In a preferred form, the transfer optic and the scintillator are bonded using optical contacting of the respective surfaces followed by heat treatment to form a virtually defect-free bond interface without the need for glues or other bonding agents. Also, preferably, the transfer optic and the scintillator have refractive indices which differ by less than about 0.1. This embodiment also finds use in an electron microscope.

In a further embodiment of the invention, the apparatus includes both of the first and second embodiments. That is, the apparatus includes both a transfer optic having a high extra-mural light absorptive layer around each optical fiber as well as having the transfer optic directly bonded to the scintillator. This combination of features provides an apparatus in which the ultimate resolution of an image sensor used to record the light images from the electron microscope is improved while not reducing the sensitivity of the apparatus. Optionally, the apparatus includes a light reflective layer positioned between the source of the electron image and the scintillator. A preferred location for the reflective layer is positioned on a surface of the scintillator. A suitable material for such a reflective layer is aluminum.

Accordingly, it is a feature of the present invention to provide resolution enhancement for image sensors which are used to record images from electron microscopes while not compromising or degrading the sensitivity of the apparatus. This, and other features and advantages of the present invention, will become apparent from the following detailed description, the accompanying drawings, and the appended claims.

DETAILED DESCRIPTION OF THE PREFERRED EMBODIMENTS

Figure 1:
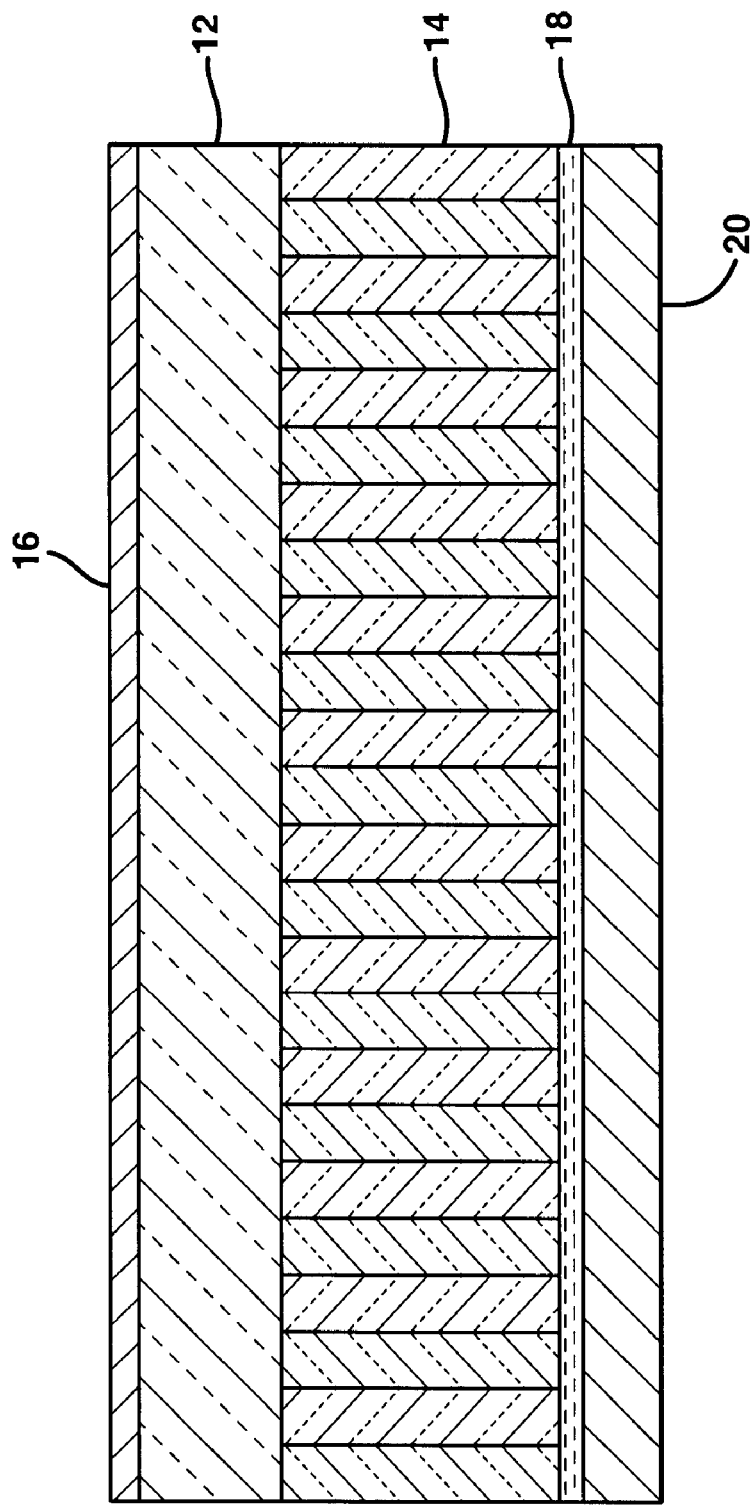
FIG. 1 is an enlarged schematic cross-sectional view of the apparatus of the present invention.

Referring to FIG. 1, the resolution enhancement apparatus of the present invention is illustrated. The resolution enhancement device, generally indicated at 10, includes scintillator 12 supported by a transfer optic such as fiber optic plate 14. In a preferred form scintillator 12 comprises a single crystal such as a yttrium-aluminum-garnet crystal. Such crystals can be manufactured to a thickness of from about 5 to 50 μm. However, it should be recognized that other scintillators may be used including polycrystalline materials and particulate materials. For example, a powdered phosphor may be coated onto the fiber optic plate to form the scintillator. Generally, particle sizes for the phosphor should be 1 μm or less, and the coating applied to a thickness of between about 1 to 25 μm to minimize random electron and light scatter from the particles.

Figure 3:
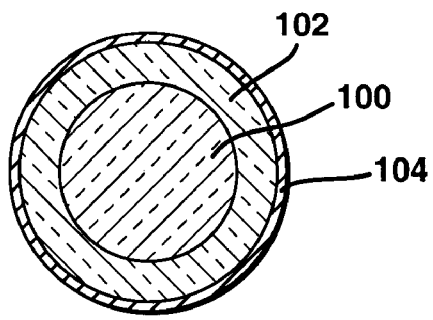
FIG. 3 is a cross-sectional view of an exemplary optical fiber, including cladding and EMA layer.
Figure 4:
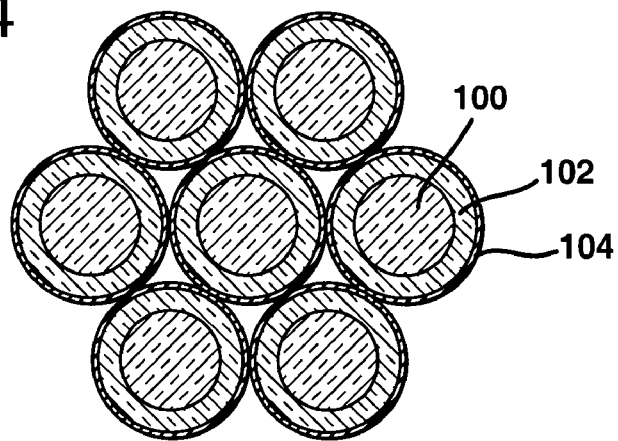
FIG. 4 is a cross-sectional view of a portion of a hexagonally stacked bundle of optical fibers.
Figure 5:
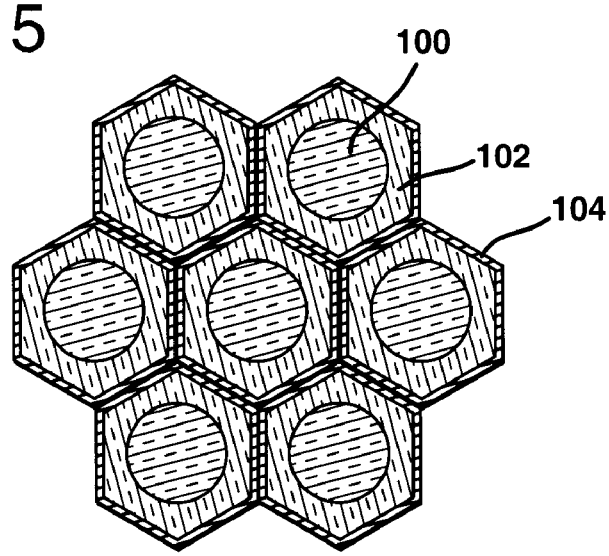
FIG. 5 is an enlarged cross-sectional view of a portion of a hexagonally packed bundle of optical fibers which have been stacked, pressed, and drawn.

AS the transfer optic, a fiber optic plate is provided which includes stacked glass fibers which are clad on their surfaces with a cladding glass or other material. Additionally, in the present invention, a layer of light absorptive material overlies the layer of cladding. FIGS. 3–5 (which are not drawn to scale) schematically illustrate, in cross-section, the general construction of such optical fibers. There, an optical fiber core 100 has a layer of cladding material 102 thereon. Preferably, optical fiber 100 is a glass having a relatively high refractive index (typically at least about 1.8). This provides a relatively close match with the refractive index of single crystal YAG scintillators (RI approx. 1.83). Preferably, the difference in refractive indices between the core glass and the scintillator is less than about 0.1. This reduces light refraction and scattering at the optical fiber/scintillator interface. Moreover, the relatively high refractive index of the core glass provides the refractive index mismatch needed with the cladding layer to provide a high numerical aperture fiber ($\geq 0.8$). Numerical aperture is defined as the sine of the half angle at which light (in air) enters a fiber, propagates along its length, and exits at the other end. Numerical aperture is a function of the refractive indices of the core glass and cladding material. Cladding layer 102 is also preferably a glass such as a boro-silicate glass. Typically, cladding glass 102 has a refractive index of about 1.5.

Overlying cladding material 102 is a layer of a light (optically) absorptive material 104. Preferably, light absorptive material 104 is a high extra mural material such as a dark colored glass (most preferably black) which is designed to substantially attenuate any high angle, off-axis light which may be scattered from adjacent optical fibers. Such glasses are also typically boro-silicate glasses having refractive indices of approximately 1.5. The glasses may be colored using techniques which are known, such as, for example, adding small amounts of certain metals to the glass composition.

Generally, the cladding material 102 and the light absorptive material 104 have slightly lower melting points than the core glass fiber so that a fiber bundle can be formed and then heated to soften the cladding and light absorptive layers to produce a fused fiber bundle. As shown schematically in FIG. 4, groups of optical fibers are gathered together to form, typically, hexagonally stacked bundles. Upon heating, the bundles of fibers may be drawn and pressed so that the bundles assume a more hexagonal shape as shown in FIG. 5. The pressed, drawn, and stacked fiber bundles are then consolidated into a fiber optic plate 14. The fiber bundles may also be cut one or more times during fabrication. As shown, the fibers in the fiber optic plates are oriented lengthwise with respect to an optical axis of the device. Typically, such fiber optic plates have a thickness on the order of a few millimeters and diameters up to about 40 mm. Individual fibers have a diameter of typically less than about 10 μm. The fiber optic plate thus has parallel oriented fibers which transmit light in an ordered fashion such that an image at one end is transferred fiber by fiber (pixel by pixel) to the other end.

Referring back again to FIG. 2, scintillator 12 optionally includes thereon a light reflective layer 16 which acts to reflect scattered light back through the transfer optic to improve the sensitivity of the apparatus. Reflective layer 16 may comprise a thin layer of a conductive metal such as aluminum which is transparent to electrons. The reflective layer thus may also perform the function of preventing the buildup of electrical charges on the apparatus which could discharge and cause arcing. Additionally, light reflective layer 16 is opaque to external light sources and prevents such light from entering the apparatus.

To further improve the resolution capabilities and sensitivity of the apparatus, scintillator 12 and fiber optic plate 14 are secured together without the use of a conventional bonding agent such as an adhesive or glue. Rather, scintillator 12 and fiber optic plate 14 are bonded through the use of an optical contacting technique and subsequent heat treatment as taught by Meissner, U.S. Pat. No. 5,846,638, the subject matter of which is incorporated by reference herein.

It is desirable that the transfer optic transfer the maximum amount of light from the scintillator to the imaging sensor. With a glue or other bonding agent, there will be some portion of the light which is reflected at each interface (scintillator/glue and glue/transfer optic) resulting in an increase in background "noise" (i.e., stray light). Providing a bonding agent-free interface increases the sensitivity of the apparatus while also improving resolution because there is less reflection and light scatter.

When combined with the light absorptive extra mural layer, high angle light entering each optical fiber and light not hitting the center of the fiber (and which gets scattered as high angle light) are substantially attenuated (absorbed), thereby also improving image resolution. High angle light is light which enters the transfer optic at an angle greater than the critical angle.

Referring back to FIG. 1, fiber optic plate 14 may be optically coupled to an imaging sensor 20 using a fluid oil 18. Such an oil, selected to have an index of refraction the same as or very close to that of the glass in fiber optic plate 14, improves the transmission of light between fiber optic plate 14 and imaging sensor 20. Further, as imaging sensor 20 will be operated at relatively low temperatures, as described in greater detail below, the coupling oil should have a low freezing point so that it will remain fluid at temperatures down to about −40° C.

Figure 2:
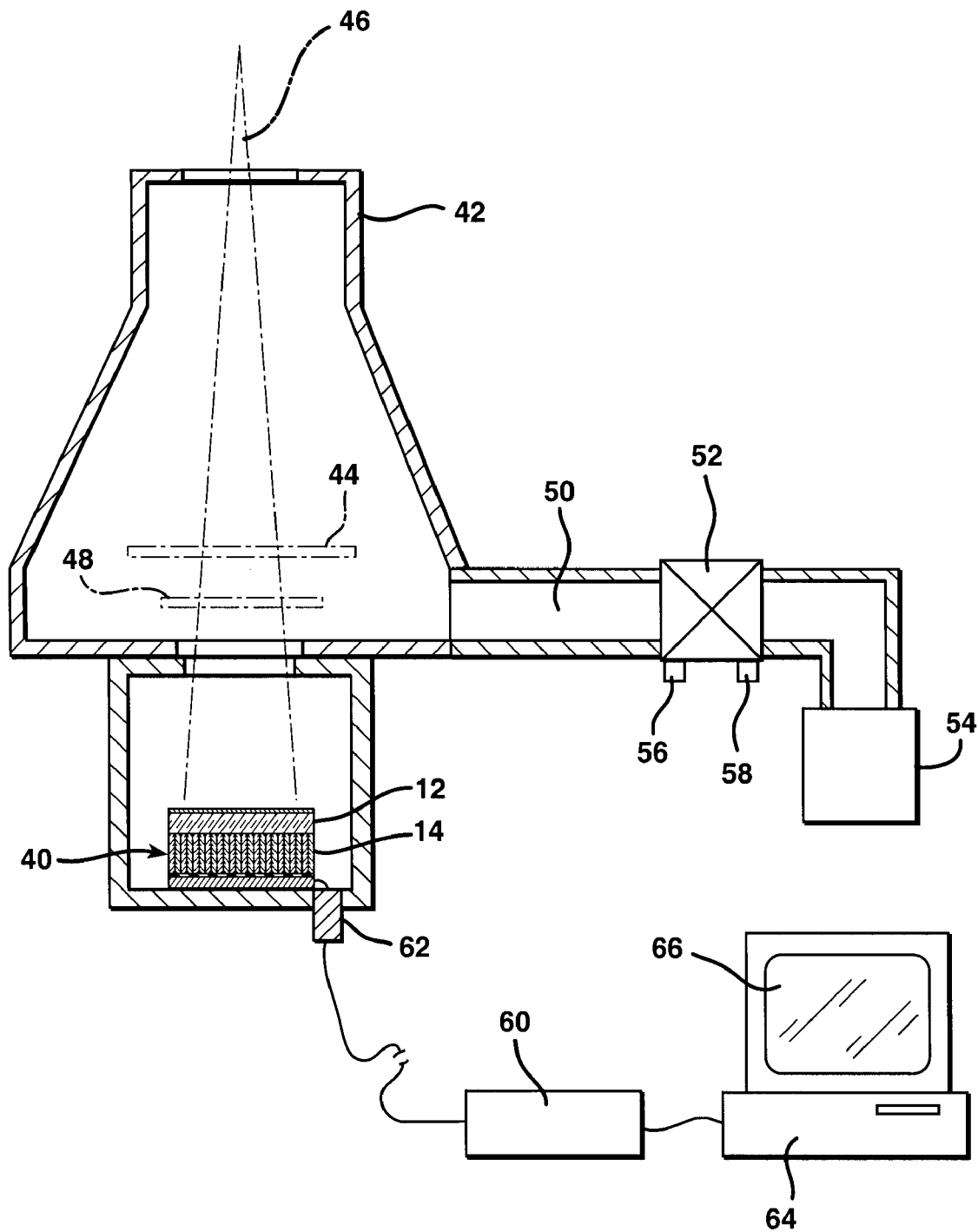
FIG. 2 is a schematic cross-sectional view of the apparatus of the present invention positioned in the projection chamber of an electron microscope.

Referring now to FIG. 2, a schematic view of a typical use of the present invention is shown in which an imaging device such as a charge-coupled device (CCD) camera 40 is mounted on the projection chamber 42 of a transmission electron microscope (TEM). As will be appreciated, the apparatus of the present invention may also find use in a scanning electron microscope (SEM), or a scanning, transmission electron microscope (STEM) as well. Typically, the projection chamber is attached to the end of an optical column of a TEM and houses a viewing screen 44 which is either lowered into an observation position or raised into a position in which it does not intercept electron beam 46 which is projected into the chamber. The projection chamber may also house a film magazine comprising a transport mechanism (not shown) which inserts a sheet of photographic film 48 into an exposure position and returns the sheet into the magazine after exposure.

The typical projection chamber further has several ports suitable for attaching an imaging device such as a camera, one of which is usually situated at the bottom of the chamber. The chamber is normally evacuated via a vacuum pipe 50 leading to a gate valve 52 which can either open or close the chamber to a high vacuum (e.g., $10^{-6}$ torr) pump 54. The gate valve in most modern TEMs is controlled pneumatically via two inlets 56 and 58 such that introduction of pressurized air into one inlet causes the valve to open, and the introduction of pressurized air into the other inlet causes the valve to close.

An electron beam 46 forming an electron image or diffraction pattern from a specimen in the microscope traverses the projection chamber 42. Camera 40 includes resolution enhancement device 10 (shown in enlarged cross-section in FIG. 1). Device 10 includes a scintillator 12 which converts the electron image into a light image. Scintillator 12 is supported on a transfer optic such as fiber optic plate 14. By light image, it is generally meant light in the visible spectrum, although there are some scintillation materials which can produce light outside of the visible spectrum in either the near infrared or in the ultraviolet regions of the spectrum. It is within the scope of the present invention to use scintillator materials which produce images in the infrared, visible, and/or ultraviolet portion of the spectrum.

Fiber optic plate 14 is optically coupled to a an imaging sensor such as a two-dimensional charge-coupled device (CCD) sensor 20 with an optically-coupling oil layer 18. Such CCD sensors are commercially available from several manufacturers including Kodak, Ford, Scientific Imaging Technologies (SITe), Hamamatsu, Thomson CSF, and English Electric Valve Ltd. Preferred solid-state imaging devices are scientific grade CCDs whose imaging areas comprise 1024×1024 or more pixels. However, it should be appreciated that any imaging device which is capable of capturing a light image and producing an electronic signal may be utilized including a cathode ray television tube.

The preferred CCD should be operated cold to keep its dark current small enough so that the noise in the dark current accumulated during a typical exposure does not limit the performance of the camera. The typical exposure in an electron microscope is from about 1 to 20 seconds. Maintaining the CCD at a temperature of about −25° to about −40° C. is typically sufficiently low for the accumulated dark current to be acceptably small at exposure times of up to about 1 minute. Such a temperature is conventionally achieved using a thermoelectric cooling device (not shown), whose cold side may be in contact with the imaging sensor 20.

The CCD is connected to an external electronics unit 60 through a vacuum feed-through 62 which transfers the captured images to the memory of a digital computer 64. The images may be displayed on a view screen 66, such as a CRT, attached to the computer. For the present invention, the images may be digitized and then displayed using Digital/Micrograph software commercially available from Gatan, Inc., Pleasanton, Calif. Other details of operation of the apparatus are set forth in commonly-owned U.S. Pat. Nos. 5,635,720 and 5,065,029, the disclosures of which are incorporated by reference.

Referring again to FIG. 2, in operation, an electron image or diffraction pattern 46 from a sample (not shown) traverses projection chamber 42 and impinges on scintillator 12. Electrons in the beam which collide with the scintillation material produce corresponding light photons which travel towards fiber optic plate 14. Light which is randomly scattered, reflected internally within scintillator 12, or deflected laterally and reflected is substantially attenuated by light absorptive layers 104 on the optical fibers.

The light image is then directed to imaging sensor 20 through the transfer optic, fiber optic plate 14. Once the image impinges on sensor 20, it is detected and then displayed on view screen 66 of digital computer 64. Because substantially all of the laterally scattered light has been absorbed previously, the image resolution is enhanced.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for improving the resolution of electron images comprising: an electron beam forming an electron image, a scintillator located in the path of said electron beam for converting said electron image into a light image, and an imaging sensor positioned to receive and record said light image, said apparatus further including a transfer optic associated with said scintillator for transferring said optical image to said imaging sensor, said transfer optic comprising at least one optical fiber including a layer of cladding material, said at least one optical fiber being oriented lengthwise with respect to an optical axis of said apparatus, said at least one optical fiber including a layer of light absorptive material on said layer of cladding material which attenuates at least a portion of off-axis light entering said transfer optic.

2. An apparatus as claimed in claim 1 in which said imaging sensor is a charge-coupled device.

3. An apparatus as claimed in claim 1 further including a light reflective layer positioned between said scintillator and the source of said electron beam.

4. An apparatus as claimed in claim 1 in which said transfer optic comprises a fiber optic plate.

5. An apparatus as claimed in claim 1 in which said scintillator comprises a yttrium-aluminum-garnet crystal.

6. An apparatus as claimed in claim 1 in which said scintillator comprises a coating of a particulate phosphor.

7. An apparatus as claimed in claim 1 wherein said cladding material and said light absorptive layer have a difference in refractive indices of less than about 0.1.

8. An apparatus as claimed in claim 1 wherein said transfer optic comprises multiple optical fibers packed in a hexagonal array.

9. In an electron microscope having a projection chamber through which an electron beam forming an electron image and/or diffraction pattern traverses, an apparatus for improving the resolution of images produced by said electron microscope and positioned in said projection chamber to intercept said electron beam comprising:

a scintillator located in the path of said electron beam for converting said electron image into a light image, and an imaging sensor positioned to receive and record said light image, said apparatus further including a transfer optic associated with said scintillator for transferring said optical image to said imaging sensor, said transfer optic comprising at least one optical fiber including a layer of cladding material, said at least one optical fiber being oriented lengthwise with respect to an optical axis of said apparatus, said at least one optical fiber including a layer of light absorptive material on said layer of cladding material which attenuates at least a portion of off-axis light entering said transfer optic.

10. An apparatus for improving the resolution of electron images comprising: an electron beam forming an electron image, a scintillator located in the path of said electron beam for converting said electron image into a light image, and an imaging sensor positioned to receive and record said light image, said apparatus further including a transfer optic associated with said scintillator for transferring said optical image to said imaging sensor, said at least one optical fiber being oriented lengthwise with respect to an optical axis of said apparatus, said transfer optic and said scintillator being bonded to one another in the absence of a bonding agent.

11. An apparatus as claimed in claim 10 in which said transfer optic and said scintillator are bonded by optical contacting and subsequent heat treatment.

12. An apparatus as claimed in claim 10 wherein said transfer optic and said scintillator have refractive indices which differ by less than about 0.1.

13. An apparatus as claimed in claim 10 in which said imaging sensor is a charge-coupled device.

14. An apparatus as claimed in claim 10 in which said transfer optic comprises a fiber optic plate.

15. An apparatus as claimed in claim 10 in which said scintillator comprises a yttrium-aluminum-garnet crystal.

16. An apparatus for improving the resolution of electron images comprising: an electron beam forming an electron image, a scintillator located in the path of said electron beam for converting said electron image into a light image, and an imaging sensor positioned to receive and record said light image, said apparatus further including a transfer optic associated with said scintillator for transferring said optical image to said imaging sensor, said transfer optic and said scintillator being bonded to one another in the absence of a bonding agent, said transfer optic comprising at least one optical fiber including a layer of cladding material, said at least one optical fiber being oriented lengthwise with respect to an optical axis of said apparatus, said at least one optical fiber including a layer of light absorptive material on said layer of cladding material which attenuates at least a portion of off-axis light entering said transfer optic.

17. An apparatus as claimed in claim 16 including a light reflective layer positioned between the source of said electron image and said scintillator.

18. An apparatus as claimed in claim 17 in which said reflective layer is positioned on a surface of said scintillator.

19. An apparatus as claimed in claim 16 in which said reflective layer comprises aluminum.

\* \* \* \* \*